United States Patent [19]

Schrenk

[11] Patent Number: 4,767,950

[45] Date of Patent: Aug. 30, 1988

[54] MOS INVERTER CIRCUIT HAVING TWO DIFFERENT SUPPLY VOLTAGES

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 883,003

[22] Filed: Jul. 7, 1986

Related U.S. Application Data

[63] Continuation of Ser. No. 640,017, Aug. 10, 1984, abandoned.

[30] Foreign Application Priority Data

Aug. 18, 1983 [DE] Fed. Rep. of Germany ....... 3329874

[51] Int. Cl.$^4$ .................. H03K 17/687; H03K 17/10; H03K 19/094; G11C 11/40
[52] U.S. Cl. .................................... 307/450; 307/270; 307/581; 307/264; 307/475; 365/226; 365/104
[58] Field of Search ............. 307/450, 453, 475, 571, 307/581, 584, 270, 264, 585, 448; 365/226, 104

[56] References Cited

U.S. PATENT DOCUMENTS

| | | | |
|---|---|---|---|
| 4,069,430 | 1/1978 | Masuda | 307/450 X |
| 4,101,788 | 7/1978 | Baker | 307/450 |
| 4,506,350 | 3/1985 | Asano et al. | 365/226 X |
| 4,555,644 | 11/1985 | Devecchi et al. | 307/450 X |
| 4,565,932 | 1/1986 | Kuo et al. | 307/475 X |

Primary Examiner—Stanley D. Miller
Assistant Examiner—David R. Bertelson
Attorney, Agent, or Firm—Herbert L. Lerner; Laurence A. Greenberg

[57] ABSTRACT

A MOS inverter circuit includes a first supply voltage source, a second supply voltage source being higher than the first supply voltage source, a control MOS FET of the enhancement type, a first load MOS FET of the depletion type connected to the control MOS FET, a parallel circuit of a second load MOS FET of the depletion type and a third MOS FET, the parallel circuit being connected in series with the first load MOS FET, the third MOS FET having a controlled path connected to the first supply voltage source, and the first and second load MOS FET's having controlled paths interconnected in series and connected to the second supply voltage source.

7 Claims, 1 Drawing Sheet

MOS INVERTER CIRCUIT HAVING TWO DIFFERENT SUPPLY VOLTAGES

This application is a continuation of application Ser. No. 640,017, filed Aug. 10, 1984, abandoned.

BACKGROUND OF THE INVENTION

1. Field of the Invention

The invention relates to a MOS inverter circuit with a first load MOS FET of the depletion type, a control MOS FET of the enhancement type, a first supply voltage and a second higher supply voltage.

As is well known, MOS inverter circuits are formed of a series circuit of a control MOS FET and a load MOS FET. For example, IBM Technical Disclosure Bulletin, Vol. 22, No. 11, April 1980, describes an inverter circuit in which the control MOS FET is of the enhancement type and the load MOS FET is of the depletion type. Such a logic circuit in N-channel silicon gate technology typically operates with a supply voltage of 5 Volt, i.e., all of the conducting control MOS FETs load the voltage source with the current flowing through the load MOS FET. In many cases, however, it is necessary to use a second, higher supply voltage of, say, 20 Volt, which can frequently have a very small current drain. An application which has been used for the higher supply voltages is for E$^2$PROMs, in which the higher supplemental voltage is obtained from a 5-Volt voltage source, such as a low-capacity voltage mutliplier circuit. Conventional MOS inverter circuits represent an undesirable, large current drain, especially for this type of voltage source.

It is accordingly an object of the invention to provide an MOS inverter circuit, which overcomes the hereinafore-mentioned disadvantages of the hertofore-known devices of this general type, and through which the current drain from the voltage source of the higher supply voltage is reduced.

SUMMARY OF THE INVENTION

With the foregoing and other objects in view there is provided, in accordance with the invention, a MOS inverter circuit, comprising a first supply voltage source, a second supply voltage source being higher than the first supply voltage source, a control MOS FET of the enhancement type, a first load MOS FET of the depletion type connected to the control MOS FET, a parallel circuit of a second load MOS FET of the depletion type and a third MOS FET, the parallel circuit being connected in series with the first load MOS FET, the third MOS FET having a controlled path connected to the first supply voltage source, and the first and second load MOS FET's having controlled paths interconnected in series and connected to the second supply voltage source.

In accordance with a further feature of the invention, the third MOS FET is of the enhancement type and is connected as a diode.

In accordance with an additional feature of the invention, the first, second and third MOS FET's are interconnected at a common node, and including a fifth MOS FET of the depletion type connected in series with the first and second load MOS FET's and having a control input connected to the common node.

In accordance with another feature of the invention, the third MOS FET is of the depletion type, and including an inverter connected between the control input of the third MOS FET and the control input of the control MOS FET.

In accordance with again an additional feature of the invention, the first, second and third MOS FET's are interconnected at a common node, and the control MOS FET, first load MOS FET and third MOS FET form a voltage divider wherein the absolute value of the cut-off voltage of the second load MOS FET is smaller than the voltage of the common node.

In accordance with still a further feature of the invention, the third MOS FET conducts better than the first load MOS FET.

In accordance with a concomitant feature of the invention, the third MOS FET has a low cut-off voltage, especially as compared to the absolute value of the cut-off voltage of the second load MOS FET.

Other features which are considered as characteristic for the invention are set forth in the appended claims.

Although the invention is illustrated and described herein as embodied in a MOS inverter circuit having two different supply voltages, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments, when read in connection with the accompanying drawings.

DESCRIPTION OF THE PREFERRED EMBODIMENTS

Figure 1:
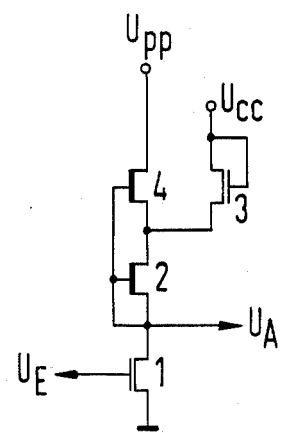
FIGS. 1 to 2 are schematic circuit diagrams of three different embodiments of a MOS inverter circuit.

Referring now to the figures of the drawing in detail and first, particularly, to FIG. 1 thereof, there is seen a MOS inverter which includes a control MOS FET 1 of the enhancement type, first and second load MOS FET's 2, 4 of the depletion type and a third MOS FET 3 of the enhancement type connected as a diode. The two load MOS FET's 2, 4 are interconnected in series and are connected through a first node to the controlled path of the control MOS FET 1. The control inputs of the first and second MOS FET's 2, 4 are likewise connected to the first node, and an output signal $U_A$ of the inverter can be taken off at the first node. A second node is connected to the drain terminal of the first load transistor 2 and to the source terminal of the second load transistor 4. The third MOS FET 3 which is connected as a diode, is connected parallel to the second load MOS FET 4 from the second node to a first supply voltage $U_{cc}$. The two load transistors are connected to a higher second supply voltage $U_{pp}$. The second supply voltage $U_{pp}$ is in the range of 20 Volt, while the first supply voltage is 5 Volt, for instance.

If the control MOS FET 1 is switched into conduction, the voltage at the first and second node is lowered relative to the second supply voltage $U_{pp}$ by a voltage divider at the load transistors 2, 4. If the voltage at the second node drops below the value of the cut-off voltage of the third MOS FET 3, the third MOS FET 3 becomes conducting, and a current flows from the voltage source of the first supply voltage $U_{CC}$ through the first load MOS FET 2 and the control MOS FET 1. If the magnitude of the cut-off voltage of the second load MOS FET 4 is smaller than the voltage at the second node which is given by a voltage divider through the third MOS FET 3, the first load MOS FET 2 and the control MOS FET 1, the second load MOS FET 4 no longer carries current. Therefore, it is not necessary for the voltage source of the second supply voltage to deliver a steady-state current. This condition is optimally met if the third MOS FET 3 is constructed in such a way that it conducts better than the first load MOS FET 2 if the cutoff voltage of the third MOS FET 3 is low and the absolute amount of the cutoff voltages of the second load MOS FET is high.

An output voltage $U_A$ delivered at the first node is either around 0 Volts, or near the second supply voltage $U_{pp}$, depending on an input voltage $U_E$. If the output voltage is larger than the first supply voltage $U_{cc}$, then the third MOS FET is cut off and does not load the voltage source of the second supply voltage $U_{pp}$.

Figure 2:
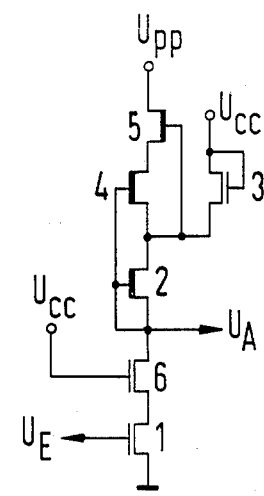

FIG. 2 shows a further embodiment of the inverter circuit which differs from FIG. 1. The embodiment of FIG. 2 is particularly well suited for high supply voltages, wherein the second supply voltage $U_{PP}$ is above the technology-limited gate-aided breakthrough voltage $U_{pn}(G)$ of a MOS FET, which has a gate voltage that is kept at 0 Volts.

A fourth MOS FET 5 of the depletion type prevents the occurrence of a $U_{pn}(G)$ breakthrough at the drain terminal of the second load transistor 4. The controlled path of the MOS FET 5 connects the second supply voltage $U_{PP}$ to the series circuit of the first and second load MOS FET's 2, 4. The control input of the MOS FET 5 is connected to the second node. The control gate of the fourth MOS FE 5 has a voltage which, according to the above-described voltage division, is slightly lower than the supply voltage $U_{cc}$. The gate-fed breakthrough voltage of the fourth MOS FET 5 is therefore also higher than the corresponding breakthrough voltage of the second load MOS FET 4 in FIG. 1, by this amount.

A series-connected sixth MOS FET 6 prevents the occurrence of a $U_{pn}(G)$ breakthrough at the drain terminal of the control MOS FET 1. The control input of the sixth MOS FET 6 is permanently connected to the first supply voltage $U_{cc}$. The breakthrough voltage of the sixth MOS FET 6 is also increased relative to the breakthrough voltage of the control MOS FE 1 according to FIG. 1. In the conducting state of the control MOS FET 1, the control input of the fourth MOS FE 5 and the second node are addressed by a voltage of several volts. The breakthrough voltage $U_{pn}(G)$ of the fifth transistor is raised by about this amount of voltage, relative to the breakthrough voltage of the second load transistor 4, as compared with the circuit according to FIG. 1.

I claim:

1. MOS inverter circuit having MOS FET transistors, each having a source, drain and a gate comprising a first supply voltage source, a second supply voltage source being higher than said first supply voltage source, a control MOS FET of the enhancement type being connected at its gate to an input voltage, a first MOS FET being a load MOS FET of the depletion type being connected at its source to the drain of said control MOS FET, forming a first node for supplying an output voltage, a second MOS FET being a load MOS FET, also of the depletion type and a third MOS FET of the enhancement type, said second and third MOS FET being connected together at their respective soruce to source forming a second node and forming a two-transistor circuit, the second node being connected with the drain of said first MOS FET, the gates of said first and second MOS FET being connected to said first node, said third MOS FET having a controlled path, and being connected with its drain and gate as a diode to said first supply voltage source, and said first and second MOS FET's having their controlled drain-source paths interconnected in series and connected at the drain of the second MOS FET to said second supply voltage source.

2. MOS inverter circuit according to claim 1, wherein said third MOS FET conducts better than said first MOS FET.

3. MOS inverter circuit according to claim 1, wherein said third MOS FET has a low cut-off voltage.

4. MOS inverter circuit having MOS FET transistors, each having a source, drain and a gate, comprising a first supply voltage source; a second supply voltage source being higher than said first supply voltage source; a control MOS FET of the enhancement type being connected at its gate to an input voltage; a first MOS FET being a load MOS FET of the depletion type being connected at its source to the drain of said control MOS FET, forming a first node for supplying an output voltage; a second MOS FET being a load MOS FET, also of the depletion type; a third MOS FET of the enhancement type; said second and third MOS FET being connected together at their respective source to source forming a second node, and forming a two-transistor circuit, the second node being connected with the drain of said first MOS FET; said third MOS FET having a controlled path, and being connected with its drain and gate as a diode to said first supply voltage source; said first and second MOS FET's having controlled paths connected in series and connected to said second supply voltage source; said first MOS FET being interconnected at its drain to said second node; and including a fourth MOS FET of the depletion type connected with its drain-source path in series with said first and second MOS FET's and having a control input connected to said second node.

5. MOS inverter circuit according to claim 4, wherein said first, second and third MOS FET's are interconnected at the second node, and said control MOS FET, first MOS FET and third MOS FET form a voltage divider wherein the absolute value of the cut-off voltage of said second MOS FET is smaller than the voltage at said second node.

6. MOS inverter circuit according to claim 5, wherein said third MOS FET has a lower cut-off voltage than the absolute value of the cut-off voltage of said second load MOS FET.

7. MOS inverter circuit according to claim 6, wherein said third MOS FET conducts better than said first MOS FET.

* * * * *